United States Patent
Schmitz et al.

(10) Patent No.: US 6,903,447 B2
(45) Date of Patent: Jun. 7, 2005

(54) APPARATUS, METHODS AND ARTICLES OF MANUFACTURE FOR PACKAGING AN INTEGRATED CIRCUIT WITH INTERNAL MATCHING

(75) Inventors: Norbert A. Schmitz, Salem, NH (US); Richard J. Giacchino, Peabody, MA (US); Wayne M. Struble, Franklin, MA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/427,330

(22) Filed: May 1, 2003

(65) Prior Publication Data

US 2004/0026766 A1 Feb. 12, 2004

Related U.S. Application Data

(63) Continuation-in-part of application No. 10/142,250, filed on May 9, 2002.

(51) Int. Cl.[7] .............................................. H01L 39/00
(52) U.S. Cl. ...................... 257/662; 257/663; 257/664; 257/665
(58) Field of Search ................................. 257/662–665

(56) References Cited

U.S. PATENT DOCUMENTS

| | | | |
|---|---|---|---|
| 3,713,006 A | 1/1973 | Litty et al. ............... 317/101 A |
| 4,200,880 A | 4/1980 | Frey ............................. 357/51 |
| 4,353,047 A | 10/1982 | Noguchi et al. | |
| 5,376,909 A | 12/1994 | Nelson et al. ............... 333/247 |
| 5,557,144 A | * 9/1996 | Rosenstock et al. ........ 257/668 |
| 5,696,466 A | 12/1997 | Li | |
| 5,963,089 A | 10/1999 | Kusunoki | |
| 6,016,084 A | 1/2000 | Sugimoto | |
| 6,049,126 A | 4/2000 | Saitoh | |
| 6,084,300 A | * 7/2000 | Oka ............................ 257/730 |
| 6,188,237 B1 | 2/2001 | Suzuki et al. | |
| 6,289,204 B1 | 9/2001 | Estes et al. | |
| 6,392,298 B1 | 5/2002 | Leighton et al. | |
| 6,456,125 B1 | 9/2002 | Miyazawa | |
| 6,528,879 B2 | * 3/2003 | Sakamoto et al. .......... 257/729 |
| 6,608,367 B1 | 8/2003 | Gibson et al. | |
| 6,621,140 B1 | 9/2003 | Gibson et al. | |
| 2002/0097094 A1 | 7/2002 | Wang et al. ................. 330/286 |
| 2003/0160307 A1 | 8/2003 | Gibson et al. | |

FOREIGN PATENT DOCUMENTS

WO  WO 00/75990 A1  12/2000  ........... H01L/23/66

OTHER PUBLICATIONS

Patent Abstracts of Japan, Publication No. 07221224, Publication Date, Aug. 18, 1995, Application Date, Feb. 4, 1994, Application Number, 06012374, Intl. Class H01L 23/12.
Written Opinion of the International Searching Authority, Applicant's or agent's file reference, 17641A PCT, International application no. PCT/US2004/013930, International filing date Apr. 3, 2004.

* cited by examiner

Primary Examiner—Luan Thai (57) ABSTRACT

An integrated circuit package houses and connects to a die to form an integrated circuit with internal matching. The package comprises a lead frame comprising at least one transmission line, a die paddle, and at least one input lead and at least one output lead. Bond wires connect select locations along the at least one transmission line to ground through impedance matching circuit components located within the integrated circuit to provide an impedance matching network associated with at least one of the output leads. The package may also substantially encapsulate the lead frame, while exposing the die paddle and the input/output leads.

37 Claims, 9 Drawing Sheets

APPARATUS, METHODS AND ARTICLES OF MANUFACTURE FOR PACKAGING AN INTEGRATED CIRCUIT WITH INTERNAL MATCHING

CROSS-REFERENCE TO RELATED APPLICATIONS

The present application is a continuation-in-part of U.S. patent application Ser. No. 10/142,250 filed May 9, 2002, the entire disclosure of which is incorporated by reference herein.

FIELD OF THE INVENTION

The present invention relates to the field of semiconductor devices, and in particular to an integrated circuit with internal impedance matching.

BACKGROUND OF THE INVENTION

In cellular telephones, radio frequency (R.F) power amplifiers (PA) are built using a semiconductor device (e.g., silicon or GaAs) that has a low output impedance (e.g., less two ohms). 1 0 This impedance needs to be transformed to a higher impedance value (e.g., fifty ohms) to connect to filters, switches, diplexers and antennas in the rest of the radio. This impedance transformation network is typically referred to as the "output match."

In addition to transforming a two-ohm impedance to fifty ohms, the output match is typically tuned at the harmonic frequencies to increase efficiency and battery life (e.g., talk time) of the cellular telephone. These harmonic frequencies extend up to 6 GHz. At these frequencies, the distance between the capacitors and other passive components used to construct the output match is critical, for example a distance of 0.001" is significant. For example, a vendor may specify distances of 0.062" and 0.416" in one one-thousandth of an inch of precision between the capacitors and other passive components of the output matching network.

The harmonic frequencies present a second problem. The capacitors have parasitic values that become significant at the harmonic frequencies. Since the parasitic values differ from one manufacturer to another, changing vendors for the same value component will yield different results.

In producing high volumes (e.g., 30,000,000 per year) these dependencies on a single vendor and tolerances of 0.001" are costly to manage. Therefore, there is a need for an improved technique for providing an impedance matching network.

SUMMARY OF THE INVENTION

Briefly, according to an embodiment of the present invention, an integrated circuit includes a die that is electrically connected to and housed within a package. The package includes a lead frame comprising a transmission line, at least one input signal lead, and at least one output signal lead that is connected to the transmission line. The die provides an output signal onto the transmission line. At least one select location along the transmission line is connected to a first electrical node through an impedance matching circuit within the integrated circuit.

According to another embodiment of the present invention, an integrated circuit package includes a lead frame comprising at least one transmission line, at least one input signal lead, and at least one output signal lead. At least one select location along the transmission line is connected to a first electrical node through an impedance matching circuit within the integrated circuit package, wherein the impedance matching circuit is associated with the output signal lead.

The impedance matching circuit may be located within the integrated circuit. For example, in one embodiment, the impedance matching circuit may be connected between the at least one select location along the transmission line and a pin of the lead frame.

In one embodiment, at least one select location along the transmission line is wire bonded to a capacitor. The capacitance value of the capacitor and the dimensions of the transmission line are selected to provide the desired matching circuit (i.e., output impedance).

Incorporating the transmission line into the lead frame avoids having to place the matching network outside of the integrated circuit. For example, etching and/or half-etching the lead frame to provide the transmission line, and placing components (e.g., capacitors, inductors, etc.) of the impedance transform matching circuit on the integrated circuit and connecting these components between select locations on the transmission line and first electrical node (e.g., ground) is relatively inexpensive.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
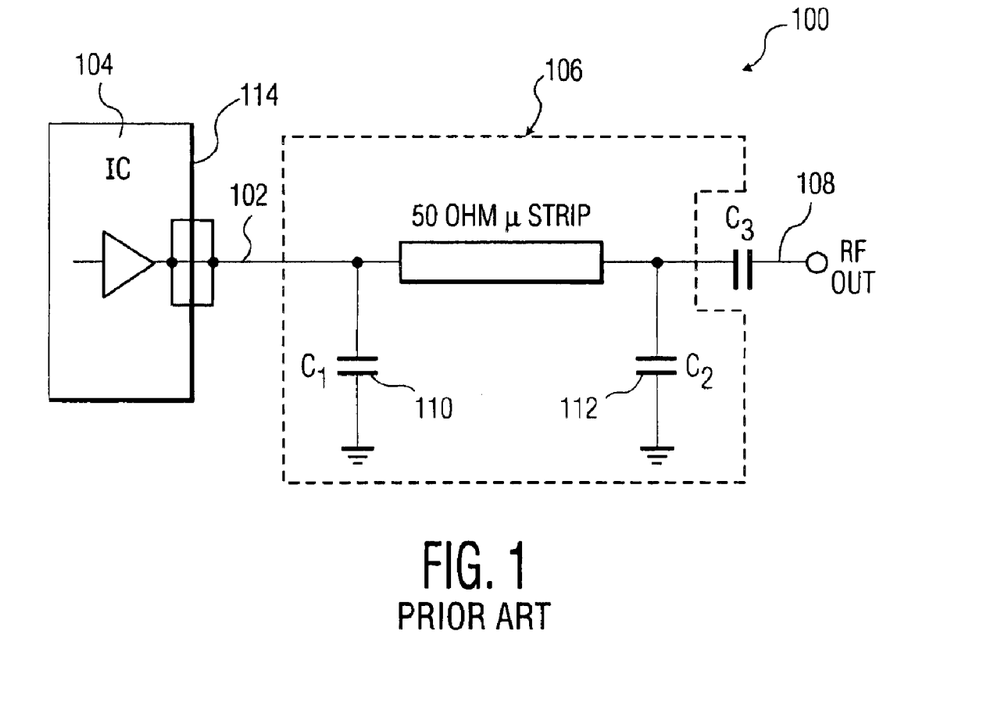
FIG. 1 illustrates a functional block diagram of a prior art matching circuit configuration for an RF output signal.

FIG. 1 illustrates a functional block diagram of an exemplary prior art matching circuit configuration 100 that provides an output signal on a line 102. In one embodiment the output signal on the line 102 is from an RF power amplifier (PA) within an integrated circuit 104. The integrated circuit 104 provides the output signal on the line 102 to an impedance transformation network 106 (also referred to herein as a "matching network"), which provides an impedance matched output signal on a line 108. For example, the impedance matched output signal on the line 108 may for example have an output impedance of fifty ohms, whereas the impedance of the signal on the line 102 may for example be two ohms. The impedance matching network 106 includes a plurality of capacitors $C_1$ 110 and $C_2$ 112 that are precisely positioned to provide the required impedance transformation and harmonic filtering. For example, the capacitor $C_1$ 110 is precisely positioned (e.g., to a 0.001" tolerance) from edge 114 of the integrated circuit 104, while the distance between capacitors $C_1$ 110 and $C_2$ 112 is also precisely controlled. As set forth above, these positioning constraints lead to a problematic and relatively costly matching network that is external to the integrated circuit 104.

Figure 2:
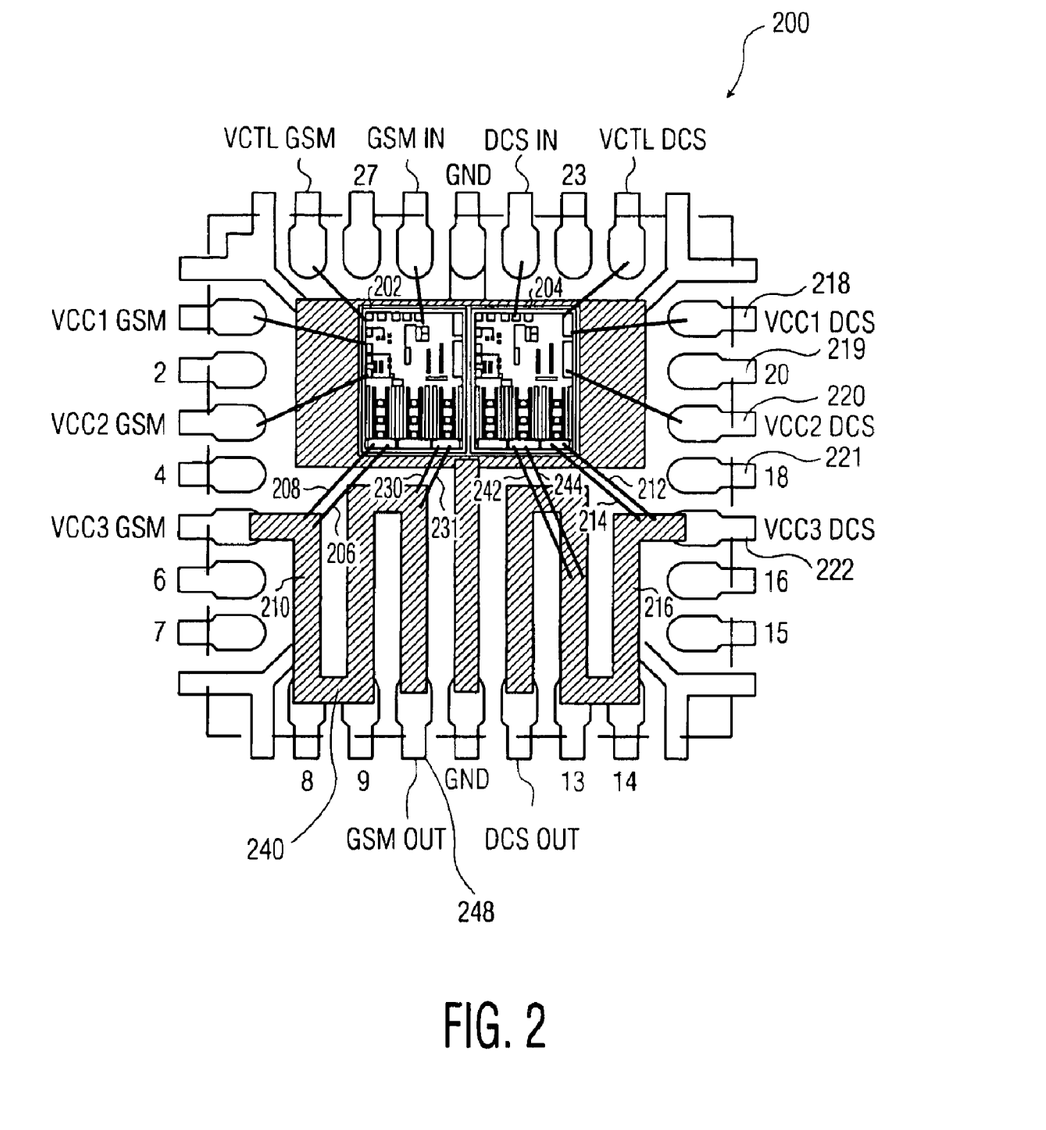
FIG. 2 is a cut-a-way top view of a first integrated circuit that includes a first die, and a second die within a first plastic package.

FIG. 2 is a cut-a-way top view of a first integrated circuit 200 that includes a first die 202, and a second die 204 within a plastic package. The first die 202 provides an output signal via bond wires 206, 208 to a first transmission line 210 located on a lead frame (e.g., etched copper). The second die 204 provides an output signal via bond wires 212, 214 to a second transmission line 216 located on the lead frame The lead frame also includes a plurality of input/output (I/O) leads (e.g., 218–222). Bond wires interconnect bonding pads on the dies and the I/O leads. According to an aspect of the present invention, the lead frame also includes at least one transmission line (e.g., 0.1 mm thick in non-exposed areas, and 0.2 mm thick in exposed areas) that cooperates with circuit components within the integrated circuit to provide an integrated circuit with internal matching. Specifically, in this embodiment matching circuit components such as capacitors and/or inductors (not shown) located on the first die 202 are connected to the first transmission line 210. For example, a first capacitor located on the first die 202 is connected to a first selected location on the transmission line 210 by bond wires 230, 231. Two bond wires are shown in this embodiment for current handling. However, a skilled person will recognize of course that more or less bond wires may be used to connect the matching circuit component on the die to the transmission line, depending upon the current handling required. In addition, a second capacitor (now shown) may be located on the die 202 and connected to a second location (e.g., location 240) on the transmission line 210 by bond wires (not shown) to provide a matching circuit that is functionally similar to the circuit 106 illustrated in FIG. 1. However, in the embodiment of FIG. 2, the matching network is located within the integrated circuit. That is, the integrated circuit of FIG. 2 includes internal matching.

The second die 204 may also include an internal matching network that is established by connecting a matching circuit component(s) within the second die 204, to the transmission line 216 for example via bond wires 242, 244.

Figure 3:
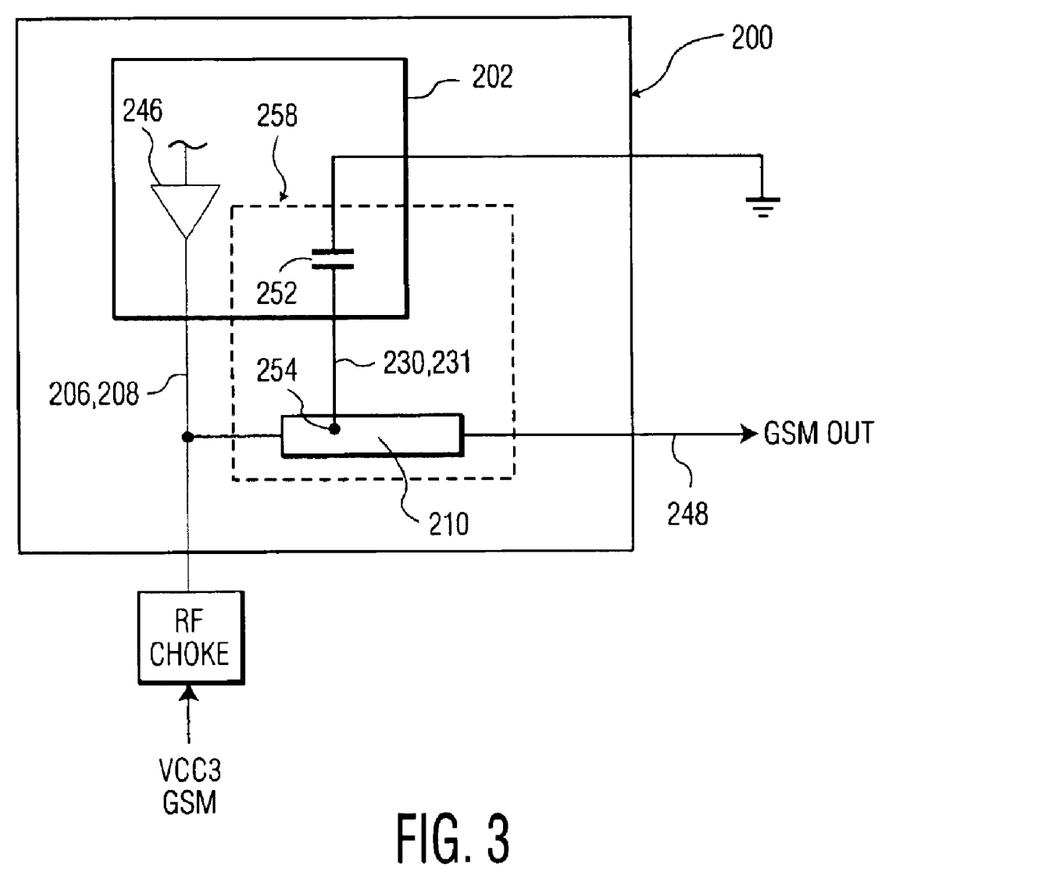
FIG. 3 is a functional block diagram illustration of the internal matching network associated with the first die illustrated in FIG. 2.

FIG. 3 is a functional block diagram illustration of the internal matching network associated with the first die 202 illustrated in FIG. 2. For example an output amplifier 246 located on the die 202 provides an output signal that is conducted by the transmission line 210 to an I/O lead 248. A first lead of a capacitor 252 located on the die 202 is connected to a first select location 254 on the transmission line 210 via the bond wires 230,231. A second lead of the capacitor 252 is connected to a first electrical potential, for example ground. Significantly, this provides an impedance matching circuit 258 that is located within the integrated circuit 200.

Figure 4:
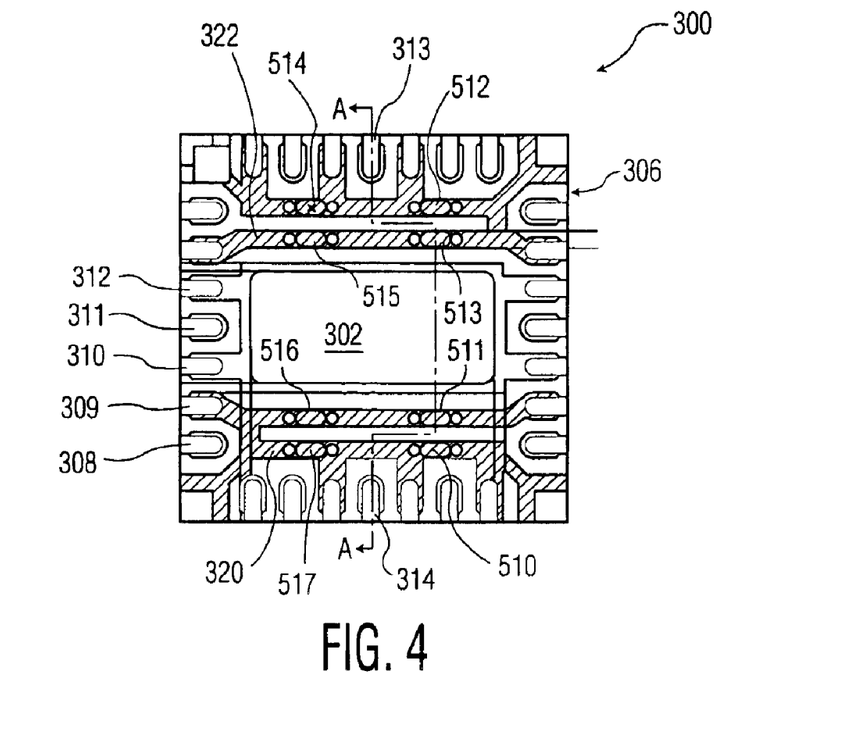
FIG. 4 is a cut-a-way top view of a lead frame of a second integrated circuit that provides at least one output signal.

FIG. 4 is a cut-a-way top view of a second integrated circuit 300 that includes a die (not shown in FIG. 4), that is placed onto a die paddle 302 of a lead-frame 306 (e.g., etched copper) that includes plurality of I/O leads (e.g., 308–314). Interconnect bonding pads located on the die are connected for example via bond wires to the I/O leads. The lead frame 306 also includes a first transmission line 320 shown in cross hatch. In this embodiment, the package also includes a second transmission line 322 that is also not exposed on the exterior of the package. The first transmission line 320 is associated with a first output signal from the package while the second transmission line is associated with a second output signal from the package. Matching circuit components such as capacitors and/or inductors (not shown) located on the die and associated with the first output signal, are connected between a first electrical potential (e.g., ground) and at least one select location on the first transmission line 320.

Figure 5:
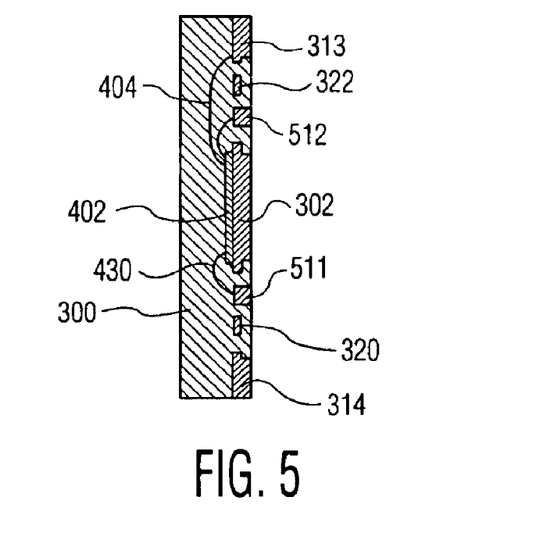
FIG. 5 illustrates a section taken along line A—A in FIG. 4.
Figure 6:
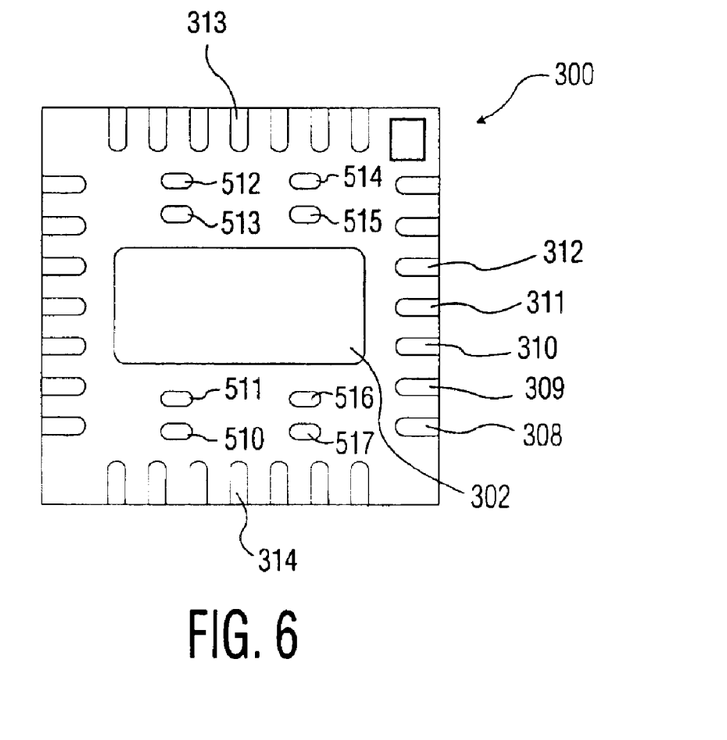
FIG. 6 illustrates a bottom view of the second plastic package of FIG. 4.

FIG. 5 illustrates a section taken along line A—A in FIG. 4. A die 402 is located on the paddle 302, and at least one bond wire 404 connects lead 313 and a bond pad (not shown) on the die 402. FIG. 6 illustrates a bottom view of the second integrated circuit. As shown, the lead frame includes the paddle 302 and the plurality of I/O leads, for example 308–314. Referring to FIGS. 5 and 6, the package also includes a plurality of exposed wire bond support structures 510–517 that represent select locations along the transmission lines at which the matching circuit components may be connected. For example, in one embodiment, these support structures (e.g., etched copper) are connection points for bond wires between the matching components on the die, and the transmission lines within the lead frame of the package. For example, bonding wire 430 (FIG. 5) runs between a matching component (e.g., a capacitor) on the die 402 and the support structure 511 (i.e., a select location on the transmission line 320).

Figure 7:
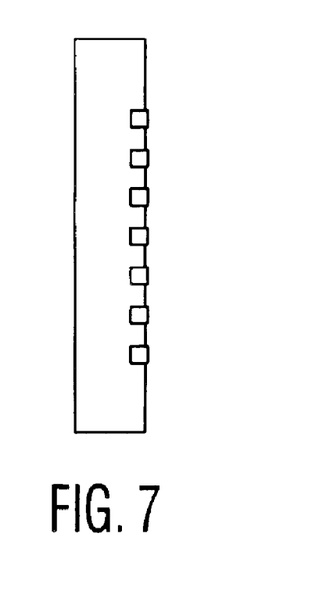
FIG. 7 illustrates a side view of the package of FIG. 6.

FIG. 7 is a side view of the package of FIG. 5.

Figure 8:
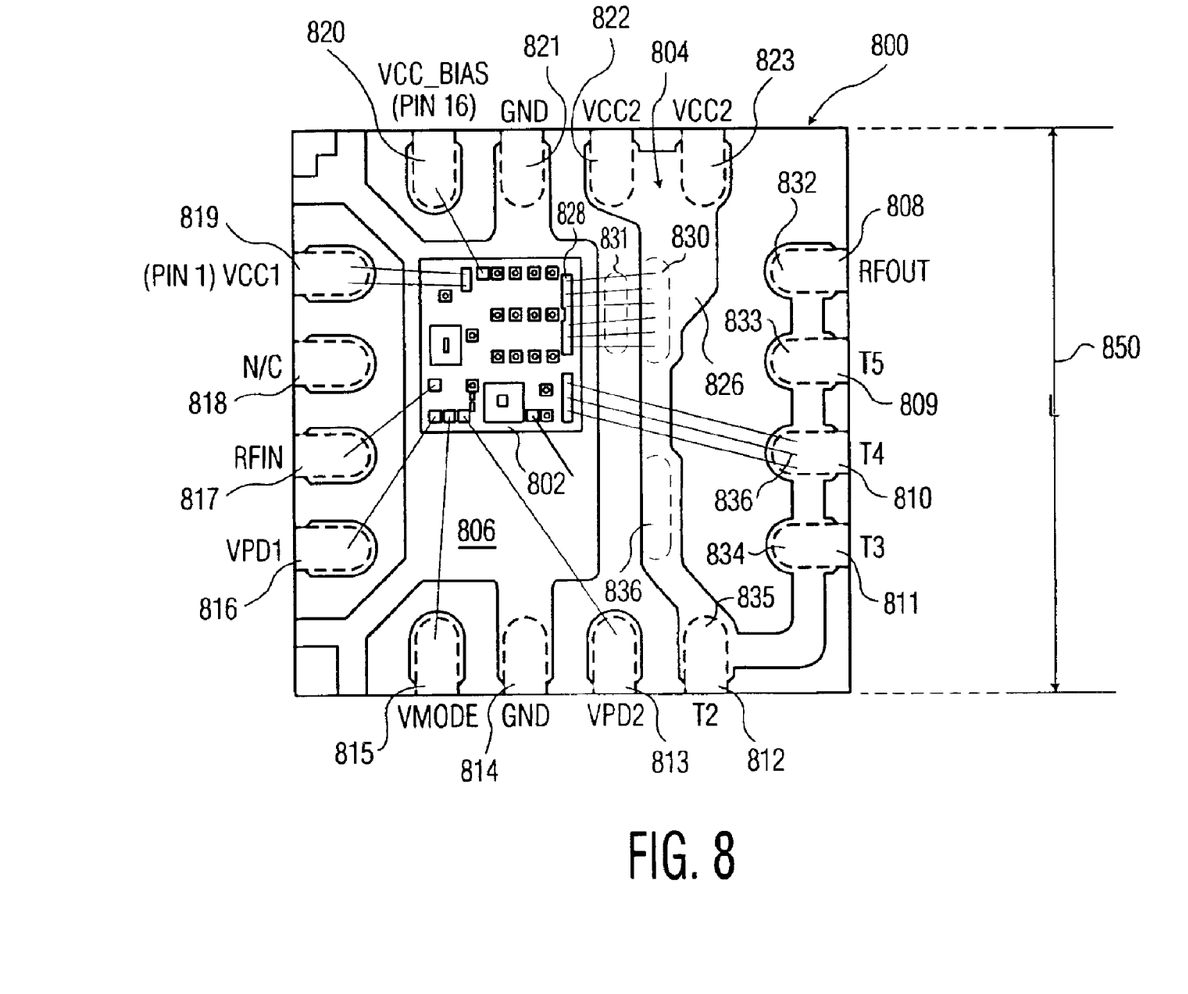
FIG. 8 is a cut-a-way top view of a lead frame of a third integrated circuit that includes an internal matching circuit located within a die.
Figure 9:
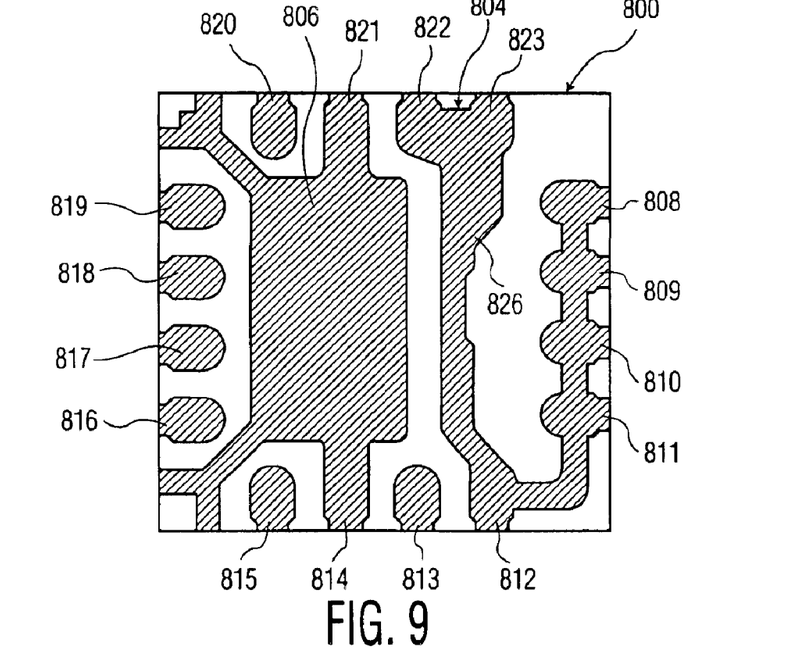
FIG. 9 is a top view of the lead frame of FIG. 8 shown in cross hatch.

FIG. 8 is a cut-a-way top view of a third integrated circuit 800 that includes a die 802, and a lead frame 804 of a third plastic package. FIG. 9 is a top view of the lead frame 8 04 of FIG. 8 shown in cross hatch. The lead frame 804 includes a die paddle 806 and a plurality of I/O leads 808–823. The lead frame also includes a transmission line 826 that connects an output 828 on the die 802 to selected I/O leads 808–812. In this embodiment, the die output 828 is connected to the transmission line 826 by a plurality of bond wires 831. The die 802 includes at least one component (e.g., a capacitor, inductor, etc.) of an impedance matching/transformation network. The network matching component within the die is connected to a first select location 830 along the transmission line 826. As a result, a circuit configuration as shown in FIG. 3 is provided. Depending upon the impedance matching and filtering requirements, the matching circuit component within the die 802 may be connected to the transmission line 826 at one of a plurality of select locations 832–836 along the transmission line, rather than at the selected location 830. In the embodiment of FIG. 8, the integrated circuit 800 is 4 mm×4 mm (i.e., L 850 is equal to 4 cm). As shown in FIG. 8, the path length of the transmission line 826 will vary pending upon the select location (e.g., 830) along the transmission line that the matching circuit component is connected to.

Figure 10:
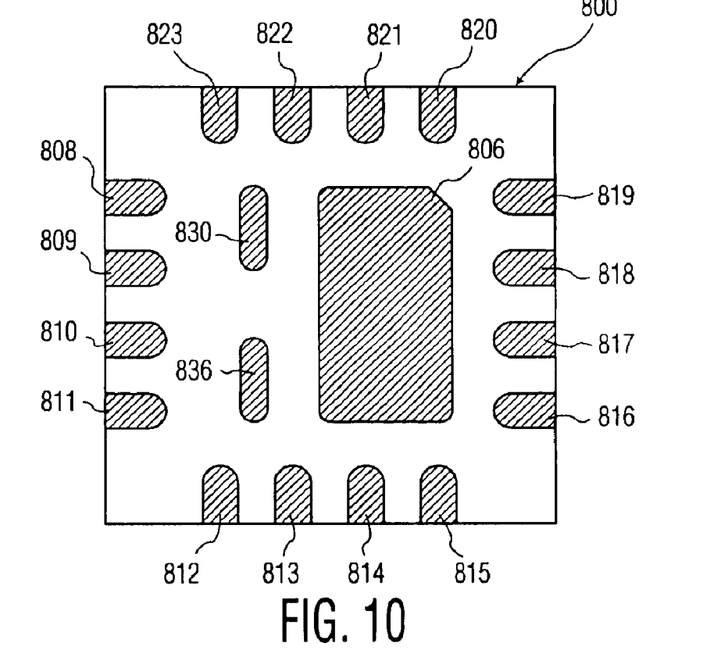
FIG. 10 is a bottom view of the led frame of FIG. 8 with exposed sections of the lead frame shown in cross hatch.

FIG. 10 is a bottom view of the lead frame of FIG. 8 shown in cross Hatch. In this view, support structures associated with the select locations 8') 0, 836 along the transmission line 826 (FIG. 9) are exposed on the underside of the integrated circuit 800.

Figure 11:
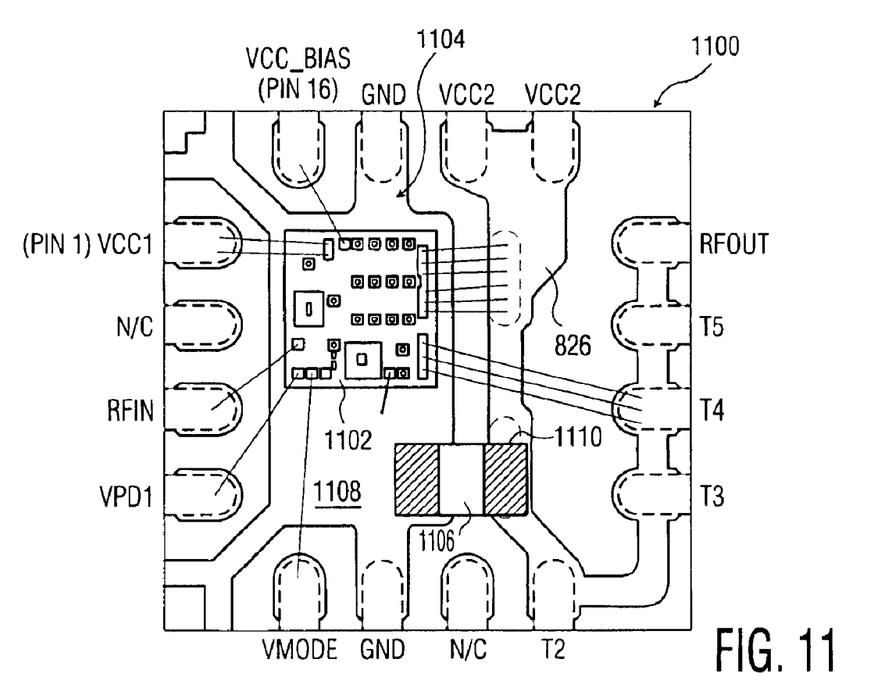
FIG. 11 is a cut-a-way top view of a lead frame of a fourth integrated circuit that includes an internal matching network located between the die paddle and a first select location on the transmission line.

FIG. 11 is a cut-a-way top view of a fourth integrated circuit 1100 that includes a die 1102, and a lead frame 1104 of a fourth plastic package. This embodiment is substantially the same as the embodiment illustrated in FIG'S. 8–10, with the principal exception that an internal matching network component 1106 (e.g., a capacitor) is located between die paddle 1108 and a first select location 1110 on the transmission line 826. That is, the internal matching circuit component is not located on the die. However, the internal matching circuit is still resident within the integrated circuit to provide the internal matching.

Figure 12:
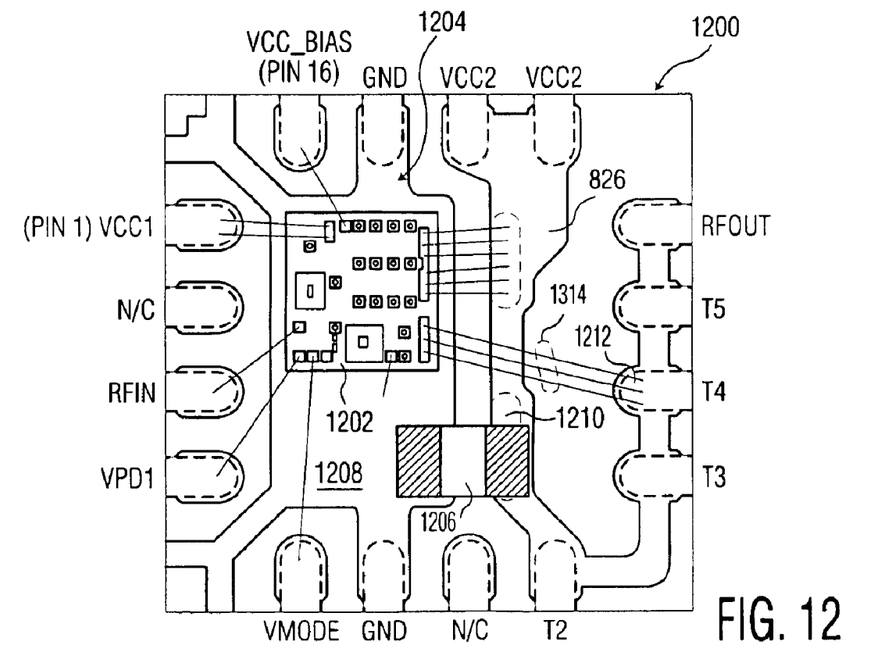
FIG. 12 is a cut-a-way top view of a lead frame of a fifth integrated circuit that includes a first internal matching network component located between the die and a first select location on the transmission line, and a second internal matching network component located between the die paddle and a second select location on the transmission line.

FIG. 12 is a cut-a-way top view of a fifth integrated circuit 1200 that includes a die 1202, and a lead frame 1204 of a fifth plastic package. This embodiment is substantially the same as the embodiments illustrated in FIGS. 8–10, and FIG. 11, with the principal exception that a first internal matching network component 1206 (e.g., a capacitor) is located between a die paddle 1208 and a first select location 1210 on the transmission line 826, and second internal matching network component (not shown) is located within the die 1202 and connected to a second select location 1212 on the transmission line.

Figure 13:
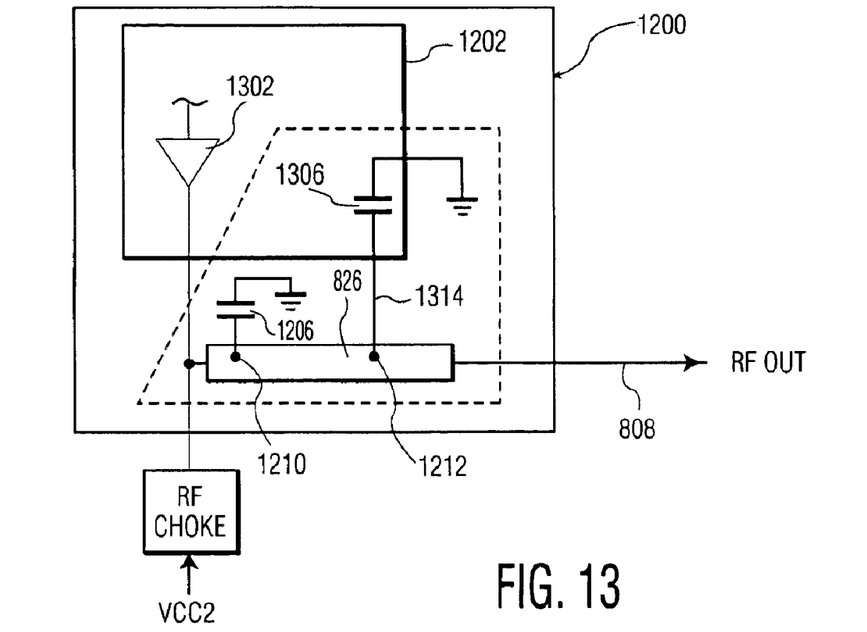
FIG. 13 is a functional block diagram illustration of the internal matching network associated with the integrated circuit of FIG. 12.

FIG. 13 is a functional block diagram illustration of the internal matching network associated with the integrated circuit of FIG. 12. For example, an output amplifier 1302 located on the die 1202 provides an output signal that is conducted by the transmission line 826 to the I/O lead 808. A first lead of a capacitor 1306 located on the die 1202 is connected to the second select location 1212 on the transmission line 826 via bond wires 1314. A second lead of the capacitor 1306 on the die is connected to a first electrical potential, for example ground. A first lead of the capacitor 1206 is connected to the first selected location 1210 on the transmission line 826, while a second lead of the capacitor 1206 is connected to the die paddle (i.e., ground).

Figure 14:
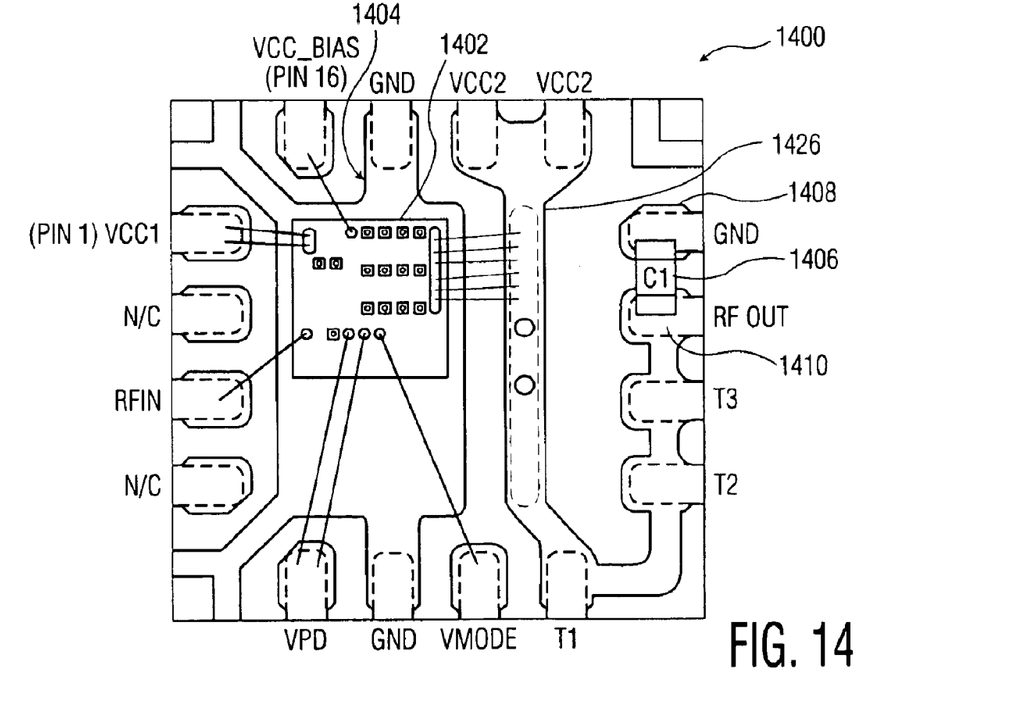
FIG. 14 is a cut-a-way top view of a lead frame of a sixth integrated circuit that includes an internal matching network located between a first select location on the transmission line and a grounded pin.

FIG. 14 is a cut-a-way top view of a sixth integrated circuit 1400 that includes a die 1402, and a lead frame 1404 of a sixth package. This embodiment is substantially the same as the embodiments illustrated in FIGS. 8–10, FIG. 11 and FIG. 12, with the principal exception that an internal matching network component 1406 is located between a first electrical potential comprising a grounded pin 1408 and a select location 1410 on the transmission line 1426. In FIG. 14, the internal matching network component is illustrated as a capacitor, although it should be understood that any other suitable components may be utilized as well, such as, for example, an inductor. Similar to that described above in connection with the earlier embodiments, the package of the present embodiment may substantially encapsulate(or encase) the integrated circuit where desired, such as, for instance, by an over-molding process utilizing any desired materials, for example, conventional thermoplastic or thermosetting materials, such as plastic, e.g., a plastic mold compound. For example, as with the other embodiments of the present invention, certain portions of the integrated circuit in the present embodiment may be substantially encapsulated, such as the lead frame, while certain other portions remain exposed, such as the die paddle and the input/output leads.

The internal matching network component 1406 illustrated in FIG. 14 may also be connected in other embodiments to the transmission line 1426 at locations other than location 1410 wherever that may be desired. Similarly, in other embodiments, the internal matching network component 1406 may be connected to portions other than the grounded pin 1408. In addition, in other embodiments, multiple matching network components may be utilized where desired, such as, for example, as illustrated in the embodiments shown in FIGS. 8–10 and FIG. 12.

Advantageously, embodiments of the present invention may provide an integrated circuit and package for internal impedance matching, thus for example freeing a handset manufacturer (or board manufacturer) from having to provide room on the board for the impedance transformation matching circuitry. In addition, embodiments of the present invention may provide a package defining a member substantially encapsulating the integrated circuit, so as to provide a barrier that can inhibit the penetration of moisture or other undesirable matter. In addition, embodiments of the present invention may utilize etched and/or half-etched features in the overall architecture of an integrated circuit. For instance, as is illustrated in FIG. 5, components 313 and 314 are examples of half etched features, which may be utilized where desired for interlocking of particular components.

Although the present invention has been discussed in the context of a package for power amplifiers for wireless handsets, it is contemplated that the many other applications will find it desirable to replace applications that require impedance matching, conventionally performed on a circuit board or as lumped element components, with matching circuitry contained within the integrated circuit. Advantageously, this obviates many of the manufacturability problems associated with having to precisely position the components of the matching circuit. In addition, although the matching network components have been connected between the transmission line and ground, the first electrical potential does not necessarily have to be ground.

Although the present invention has been shown and described with respect to several preferred embodiments thereof, various changes, omissions and additions to the form and detail thereof, may be made therein, without departing from the spirit and scope of the invention.

What is claimed is:

1. An internally matched integrated circuit, comprising:
    a package that includes a lead frame comprising at least one input signal lead, at least one output signal lead, and at least one transmission line that is connected to said at least one output signal lead; and
    a die that is electrically connected to and housed within said package, and provides a signal onto said at least one transmission line;

wherein a select location along said at least one transmission line is electrically connected to a first electrical potential through an impedance matching circuit located on said integrated circuit to provide for a predetermined impedance transformation.

2. The internally matched integrated circuit of claim 1, wherein said select location along said transmission line and said impedance matching circuit are connected via at least one bond wire.

3. The internally matched integrated circuit of claim 2, wherein said impedance matching circuit comprises a capacitor.

4. The internally matched integrated circuit of claim 2, wherein said impedance matching circuit compromises an inductor.

5. The internally matched integrated circuit of claim 2, wherein said die comprises a GaAs device.

6. The internally matched integrated circuit of claim 2, wherein said die comprises a silicon die.

7. The internally matched integrated circuit of claim 1, wherein said first electrical potential comprises a grounded pin.

8. The internally matched integrated circuit of claim 1, wherein said package substantially encases said lead frame.

9. The internally matched integrated circuit of claim 1, wherein said package is plastic.

10. The internally matched integrated circuit of claim 1, wherein said die provides at least one of an input signal or an output signal onto said at least one transmission line.

11. An internally matched integrated circuit, comprising:
a package that includes a lead frame comprising at least one transmission line, a die paddle, at least one input signal lead, and at least one output signal lead that is connected to said at least one transmission line; and
a die associated with said die paddle that is electrically connected to and housed within said package, and provides a signal onto said at least one transmission line;
wherein at least one select location on said at least one transmission line is electrically connected to a first electrical potential through an impedance matching circuit to provide for a predetermined impedance transformation.

12. The internally matched integrated circuit of claim 11, wherein said impedance matching circuit comprises a capacitor having a first lead connected to said select location along said transmission line, and a second lead connected to said first electrical potential.

13. The internally matched integrated claim of claim 11, wherein said impedance matching circuit comprises an inductor having a first lead connected to said select location along said transmission line, and a second lead connected to said first electrical potential.

14. The internally matched integrated circuit of claim 11, wherein said impedance matching circuit includes a first lead connected to said select location along said transmission line, and a second lead connected to said first electrical potential.

15. The internally matched integrated circuit of claim 11, wherein said transmission line has a length of at least one millimeter.

16. The internally matched integrated circuit of claim 11, wherein said first electrical potential comprises a grounded pin.

17. The internally matched integrated circuit of claim 11, wherein said package substantially encases said lead frame.

18. The internally matched integrated circuit of claim 11, wherein said package is plastic.

19. The internally matched integrated circuit of claim 11, wherein said die provides at least one of an input signal or an output signal onto said at least one transmission line.

20. An integrated circuit package that houses and electrically connects to a die to form an integrated circuit with internal matching, said package comprising:
a lead frame comprising a transmission line, a die paddle, a plurality of input leads, and a plurality of output leads, at least one which is connected to said transmission line, wherein at least one select location along said transmission line is electrically connected to a first electrical node through an impedance matching circuit contained within said package to provide an impedance matching network associated with said at least one of said output leads connected to said transmission line to provide for a predetermined impedance transformation; and
a member that substantially encases said lead frame, while exposing said die paddle and said input leads and said output leads.

21. The integrated circuit package of claim 20, wherein said transmission line comprises at least one of etched or half-etched copper.

22. The integrated circuit package of claim 20, wherein said impedance matching circuit comprises a capacitor.

23. The integrated circuit package of claim 20, wherein said impedance matching circuit comprises an inductor.

24. The integrated circuit packager of claim 20, wherein said impedance matching circuit is located on said integrated circuit.

25. The integrated circuit package of claim 20, wherein said first electrical node comprises a pin, and said impedance matching circuit includes a capacitor having a first lead connected to said pin and a second lead connected to said location on said transmission line.

26. The integrated circuit package of claim 20, wherein said input leads and said output leads are a first width and said transmission line is a second width, said first width and said second width having different magnitudes.

27. An internally matched integrated circuit comprising:
a package that includes a lead frame comprising a plurality of input leads and a plurality of output leads, and at least one transmission line that is connected to at least one of said output leads; and.
a die that is electrically connected to and housed within said package, and provides a signal onto said at least one transmission line;
wherein a select location along said at least one transmission line is electrically connected to a first electrical potential through an impedance matching circuit located within the integrated circuit to provide for pre-selected harmonic filtering.

28. The internally matched integrated circuit of claim 27, wherein said package substantially encases said lead frame.

29. The internally matched integrated circuit of claim 27, wherein said package is plastic.

30. The internally matched integrated circuit of claim 27, wherein said die provides at least one of an input signal or an output signal onto said at least one transmission line.

31. The internally matched integrated circuit of claim 27, wherein said die is GaAs.

32. The integrated circuit package of claim 27, wherein said transmission line comprises at least one of etched or half-etched copper.

33. The internally matched integrated circuit of claim 27, wherein said first electrical potential comprises a grounded pin.

34. An internally matched integrated circuit, comprising:
- a package that includes a lead frame comprising at least one input signal lead, at least one output signal lead, and at least one transmission line that is connected to said at least one output signal lead; and
- a die that is electrically connected to and housed within said package, and provides a signal onto said at least one transmission line;
- wherein a select location along said at least one transmission line is electrically connected to a first electrical potential through an impedance matching circuit having a plurality of components, at least one of said components being located on said die.

35. The internally matched integrated circuit of claim 34, wherein said die includes a power amplifier.

36. The internally matched integrated circuit of claim 35, wherein said power amplifier is a radio frequency power amplifier.

37. The internally matched integrated circuit of claim 35, wherein said power amplifier provides at least one of an input signal or an output signal onto said at least one transmission line.

* * * * *